United States Patent
Park et al.

(10) Patent No.: US 8,159,016 B2
(45) Date of Patent: Apr. 17, 2012

(54) CAPACITOR OF A SEMICONDUCTOR DEVICE

(75) Inventors: Sung-ho Park, Seoul (KR); Jung-hyun Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 121 days.

(21) Appl. No.: 11/011,479

(22) Filed: Dec. 15, 2004

(65) Prior Publication Data

US 2005/0145916 A1 Jul. 7, 2005

(30) Foreign Application Priority Data

Dec. 15, 2003 (KR) .................. 10-2003-0091170

(51) Int. Cl.
 *H01L 27/108* (2006.01)
(52) U.S. Cl. ............... 257/310; 257/532; 257/E27.086; 438/253
(58) Field of Classification Search .............. 257/310, 257/532, E27.086; 438/253
 See application file for complete search history.

(56) References Cited

U.S. PATENT DOCUMENTS

| 5,290,609 | A |   | 3/1994  | Horiike et al. |         |
|-----------|---|---|---------|----------------|---------|
| 6,156,600 | A | * | 12/2000 | Chao et al.    | 438/238 |
| 6,320,244 | B1| * | 11/2001 | Alers et al.   | 257/534 |
| 6,455,328 | B2|   | 9/2002  | Bachhofer et al.|        |
| 6,495,878 | B1| * | 12/2002 | Hayashi et al. | 257/310 |
| 6,617,206 | B1| * | 9/2003  | Sandhu et al.  | 438/240 |
| 6,693,321 | B1| * | 2/2004  | Zheng et al.   | 257/314 |
| 2002/0074582 | A1| * | 6/2002 | Hiratani et al.| 257/296 |
| 2002/0074584 | A1| * | 6/2002 | Yang           | 257/300 |
| 2002/0142560 | A1| * | 10/2002| Reinberg       | 438/396 |
| 2002/0153579 | A1| * | 10/2002| Yamamoto       | 257/412 |
| 2003/0011012 | A1| * | 1/2003 | Rhodes         | 257/303 |
| 2003/0116795 | A1| * | 6/2003 | Joo            | 257/296 |
| 2003/0151083 | A1| * | 8/2003 | Matsui et al.  | 257/310 |
| 2004/0087081 | A1| * | 5/2004 | Aitchison et al.| 438/240|
| 2004/0113235 | A1| * | 6/2004 | Coolbaugh et al.| 257/532|
| 2005/0087790 | A1| * | 4/2005 | Dornisch et al.| 257/310 |

FOREIGN PATENT DOCUMENTS

| CN | 1 311 527   | 9/2001  |
|----|-------------|---------|
| JP | 5-267567    | 10/1993 |
| JP | 2003-243534 | 8/2003  |

* cited by examiner

*Primary Examiner* — Steven J Fulk
(74) *Attorney, Agent, or Firm* — Harness, Dickey & Pierce, P.L.C.

(57) ABSTRACT

A capacitor of a semiconductor device, and a method of manufacturing the capacitor of the semiconductor device, include a lower electrode layer, a dielectric layer, and an upper electrode layer, wherein the dielectric layer includes tantalum (Ta) oxide and an oxide of a Group 5 element, such as niobium (Nb) or vanadium (V).

10 Claims, 5 Drawing Sheets

CAPACITOR OF A SEMICONDUCTOR DEVICE

BACKGROUND OF THE INVENTION

1. Field of the Invention

The present invention relates to a capacitor of a semiconductor device and a manufacturing method thereof. More particularly, the present invention relates to a capacitor of a semiconductor device and a method of manufacturing the capacitor of the semiconductor device, which can crystallize a dielectric layer of the capacitor of the semiconductor device even at low temperatures by forming the dielectric layer of a niobium (Nb)-based tantalum oxide layer, thereby improving the performance of the semiconductor device.

2. Description of the Related Art

Due to the sophistication of semiconductor processes, an integration density of semiconductor integrated circuits and an operating speed of semiconductor devices equipped with such semiconductor integrated circuits have dramatically increased. Various methods of increasing the storage capacity of a semiconductor memory device having a capacitor, such as dynamic random access memory (DRAM), while reducing the size of the semiconductor memory device, have been extensively researched. In addition, in order to provide at least minimally required effective capacitance while increasing the integration density of semiconductor devices, various shapes of capacitors, e.g., stack-type, cylindrical, and pin-type capacitors, have been developed. Moreover, various efforts also have been made to decrease a thickness-of-oxide (Tox) of semiconductor devices for data storage, such as DRAMs, even when high dielectric materials are used for increasing the integration density of semiconductor devices.

FIG. 1 illustrates a cross-sectional view of a conventional semiconductor device having a capacitor formed of a high dielectric material. Referring to FIG. 1, the semiconductor device includes a semiconductor substrate 11, e.g., a silicon substrate, and a polysilicon layer 12 formed on the semiconductor substrate 11. In a capacitor of the conventional semiconductor device, a lower electrode layer, a dielectric layer 15, and an upper electrode layer 16 are sequentially stacked on the polysilicon layer 12. The lower electrode layer is formed of a double layer of a titanium nitride (TiN) layer 13 and a ruthenium (Ru) layer 14. Here, the TiN layer 13 serves as a barrier layer for preventing impurities from the substrate 11 from diffusing into upper layers. The dielectric layer is formed of a tantalum oxide ($Ta_2O_5$) layer 15. The upper electrode layer 16 is formed on the $Ta_2O_5$ layer 15.

A typical DRAM can be formed by coating $Ta_2O_5$, which is a high dielectric material, on the substrate 11 using a chemical vapor deposition (CVD) or atomic layer deposition (ALD) method. The $Ta_2O_5$ layer is crystallized so that it can have electrical characteristics. In order to provide the $Ta_2O_5$ layer 15 with electrical characteristics, it is necessary to crystallize the $Ta_2O_5$ layer 15 by performing a heat treatment process on the $Ta_2O_5$ layer 15 at a temperature of about 700° C. or higher. During the heat-treatment of the $Ta_2O_5$ layer 15, however, oxygen radicals contained in the Ru layer 14 may diffuse into the lower TiN layer 13, which is below the Ru layer 14. Resultantly, the TiN layer 13 may be undesirably oxidized or deformed. In order to prevent the oxidization or deformation of the TiN layer 13, the $Ta_2O_5$ layer 15 should be heat-treated at a low temperature. Disadvantageously, when the heat treatment is performed at a low temperature, the $Ta_2O_5$ layer 15 may not be crystallized, thereby deteriorating the electrical characteristics of the $Ta_2O_5$ layer 15.

SUMMARY OF THE INVENTION

The present invention is therefore directed to a semiconductor device having a capacitor and a method of manufacturing the capacitor of the semiconductor device, which substantially overcome one or more of the problems due to the limitations and disadvantages of the related art.

It is a feature of an embodiment of the present invention to provide a semiconductor device having a capacitor and a method of manufacturing the capacitor of the semiconductor device, which can prevent a lower electrode from being oxidized while providing excellent electrical characteristics of a dielectric layer (e.g., a tantalum oxide layer) of the capacitor.

It is another feature of an embodiment of the present invention to provide a semiconductor device having a capacitor and a method of manufacturing the capacitor of the semiconductor device, which can provide structural stability of a capacitor by heat-treating a dielectric layer of the capacitor at a low temperature to provide the dielectric layer with electrical characteristics.

It is still another feature of an embodiment of the present invention to provide a semiconductor device having a capacitor and a method of manufacturing the capacitor of the semiconductor device, which can provide a high-density semiconductor device using the capacitor.

At least one of the above and other features and advantages of the present invention may be realized by providing a capacitor of a semiconductor device including a lower electrode layer, a dielectric layer, and an upper electrode layer, wherein the dielectric layer includes tantalum (Ta) oxide and an oxide of a Group 5 element.

The Group 5 element may be niobium (Nb) or vanadium (V).

The dielectric layer may include tantalum (Ta) oxide and niobium (Nb) oxide.

The lower electrode layer may include a titanium nitride (TiN) layer and a ruthenium (Ru) layer formed on the TiN layer.

The upper electrode layer may include a titanium nitride (TiN) or ruthenium (Ru) layer.

At least one of the above and other features and advantages of the present invention may be realized by providing a method of manufacturing a capacitor of a semiconductor device, the capacitor including a lower electrode layer, a dielectric layer, and an upper electrode layer, the method including (a) forming the lower electrode layer on a semiconductor substrate, (b) forming the dielectric layer on the lower electrode layer, the dielectric layer including a tantalum (Ta) oxide layer and an oxide layer of another Group 5 element, and (c) forming the upper electrode layer on the dielectric layer.

The Ta oxide layer may be thicker than the oxide layer of another Group 5 element.

Forming the dielectric layer including the Ta oxide layer and the oxide layer of another Group 5 element may include vaporizing and reacting niobium (Nb) ethylate and Ta ethylate with oxygen gas ($O_2$) and depositing the reaction results on the lower electrode at a temperature of about 250-400° C.

Forming the lower electrode layer on the semiconductor substrate may include forming a titanium nitride (TiN) layer on the semiconductor substrate, the TiN layer for preventing impurities from the semiconductor substrate from diffusing into upper layers, and forming a ruthenium (Ru) layer on the TiN layer.

Forming the dielectric layer on the lower electrode layer may include forming a niobium (Nb) oxide layer on the lower electrode layer, forming a tantalum (Ta) oxide layer on the Nb oxide layer, and heat-treating the Nb oxide layer and the Ta oxide layer at a temperature of about 650° C. or lower. Alternatively, forming the dielectric layer on the lower electrode layer may include forming a tantalum (Ta) oxide layer on the lower electrode layer, forming a niobium (Nb) oxide layer on the Ta oxide layer, and heat-treating the Ta oxide layer and the Nb oxide layer at a temperature of about 650° C. or lower. As a further alternative, forming the dielectric layer on the lower electrode layer may include sequentially forming a first tantalum (Ta) oxide layer, a niobium (Nb) oxide layer, and a second tantalum (Ta) oxide layer on the lower electrode layer and heat-treating the first Ta oxide layer, the Nb oxide layer, and the second Ta oxide layer at a temperature of about 650° C. or lower.

Forming the upper electrode layer on the dielectric layer may include depositing titanium nitride (TiN) or ruthenium (Ru) on the dielectric layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
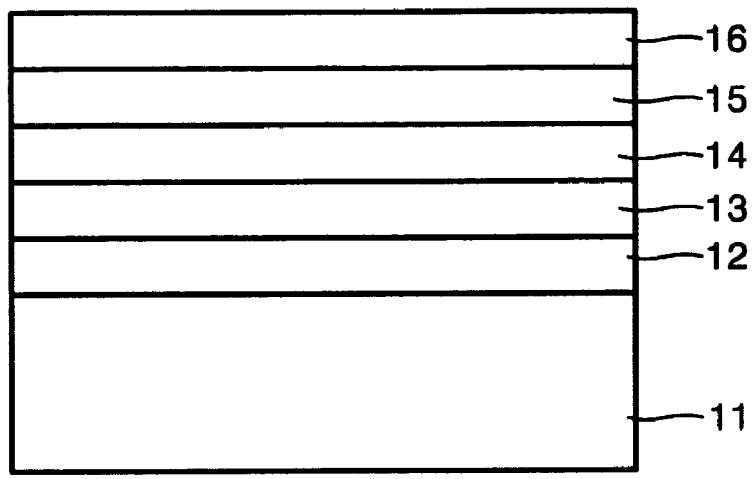
FIG. 1 illustrates a cross-sectional view of a conventional semiconductor device.

Korean Patent Application No. 2003-91170, filed on Dec. 15, 2003, in the Korean Intellectual Property Office, and entitled: "Capacitor of a Semiconductor Device and Manufacturing Method Thereof," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Like reference numerals refer to like elements throughout.

Figure 2:
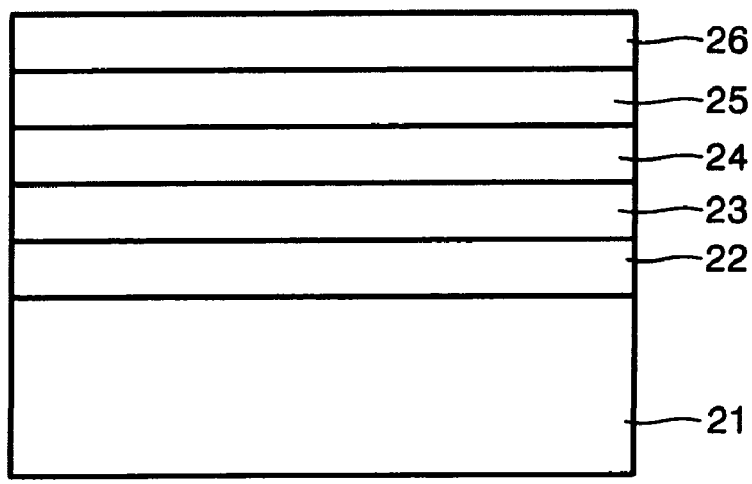
FIG. 2 illustrates a cross-sectional view of a capacitor of a semiconductor device according to an exemplary embodiment of the present invention.

FIG. 2 illustrates a cross-sectional view of a capacitor of a semiconductor device according to an exemplary embodiment of the present invention. Referring to FIG. 2, the semiconductor device includes a semiconductor substrate 21, e.g., a silicon substrate, and a polysilicon layer 22 formed on the semiconductor substrate 21. A lower electrode layer, a dielectric layer 25, and an upper electrode layer 26 are sequentially formed on the polysilicon layer 22. The lower electrode layer may be formed of a double layer of a titanium nitride (TiN) layer 23 and a ruthenium (Ru) layer 24, and serves as a barrier layer for preventing impurities from the substrate 21 from diffusing into upper layers. The dielectric layer 25 may be formed of a tantalum oxide layer, e.g., a $Ta_2O_5$ layer, and the upper electrode layer 26 is formed on the dielectric layer 25.

In the present invention, the dielectric layer 25 may contain tantalum (Ta) oxide, e.g., $Ta_2O_5$, and niobium (Nb) oxide, e.g., $Nb_2O_5$. Alternatively, Nb may be replaced by another Group 5 element, such as vanadium (V). By forming the dielectric layer 25 of a combination of Ta oxide and Nb oxide, the dielectric layer 25 can be heat-treated and then crystallized even at a low temperature of about 650° C. or lower.

FIGS. 3A through 3E illustrate cross-sectional views of stages in a method of manufacturing a capacitor of a semiconductor device according to an exemplary embodiment of the present invention.

Figure 3A:
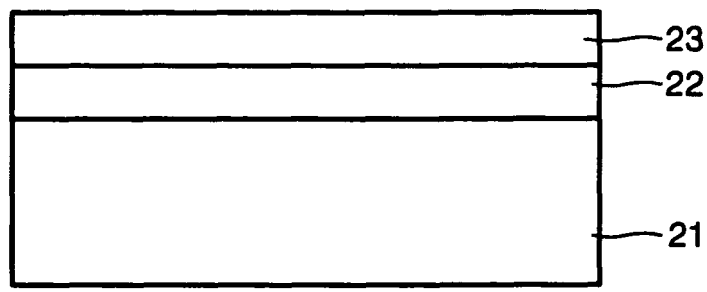
FIGS. 3A through 3E illustrate cross-sectional views of stages in a method of manufacturing a capacitor of a semiconductor device according to an exemplary embodiment of the present invention.

Referring to FIG. 3A, the polysilicon layer 22 is formed on the semiconductor substrate 21, e.g., a silicon substrate. The TiN layer 23 may be formed on the polysilicon layer 22 through a sputtering process. The TiN layer 23 serves as a barrier layer for preventing impurities from the semiconductor substrate 21 from diffusing into upper layers.

Figure 3B:
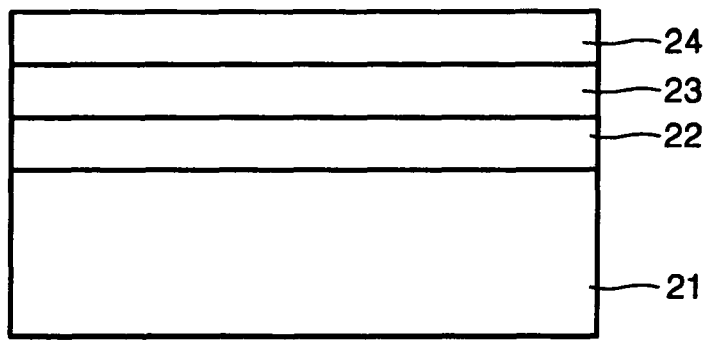

Referring to FIG. 3B, the Ru layer 24 may be formed on the TiN layer 23. The Ru layer 24 may be formed through a vapor deposition process, as is in the prior art.

Figure 3C:
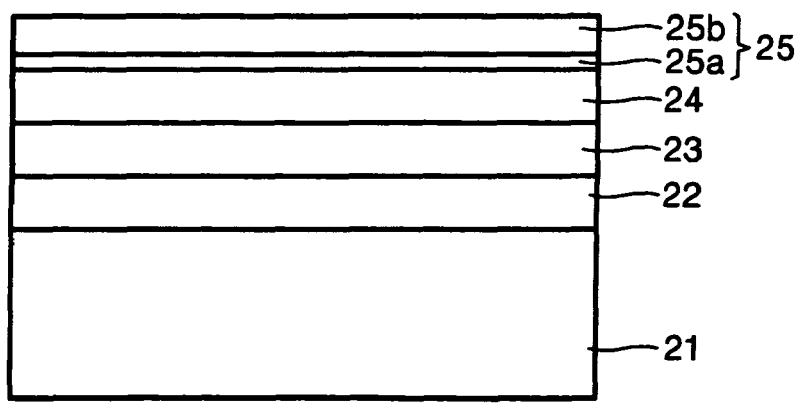

Referring to FIG. 3C, the dielectric layer 25 may be formed of a double layer of an Nb oxide layer 25a (e.g., an $Nb_2O_5$ layer) and a Ta oxide layer 25b (e.g., a $Ta_2O_5$ layer) by sequentially forming the Nb oxide layer 25a and the Ta oxide layer 25b on the Ru layer 24 through a CVD or ALD method. Preferably, but not necessarily, the Ta oxide layer 25b is thicker than the Nb oxide layer 25a. The Nb oxide layer 25a may be replaced with an oxide layer of any element of Group 5 of the periodic table, e.g., vanadium (V). The Nb oxide layer 25a and the Ta oxide layer 25b may be formed by vaporizing Nb ethylate and Ta ethylate to be able to react with oxygen gas ($O_2$), reacting the vaporized Nb ethylate and Ta ethylate with $O_2$ gas, and depositing the reaction results, i.e., Nb oxide and Ta oxide, on the Ru layer 24 at a temperature of about 250-400° C.

Figure 4A:
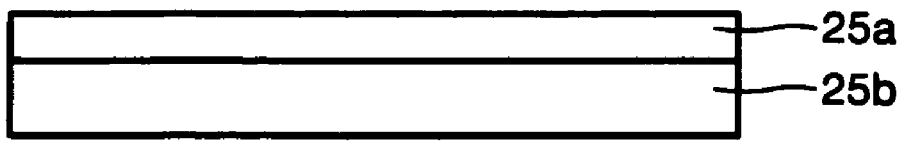
FIGS. 4A and 4B illustrate cross-sectional views of variations of a dielectric layer of the capacitor of the semiconductor device according to the exemplary embodiment of the present invention.
Figure 4B:
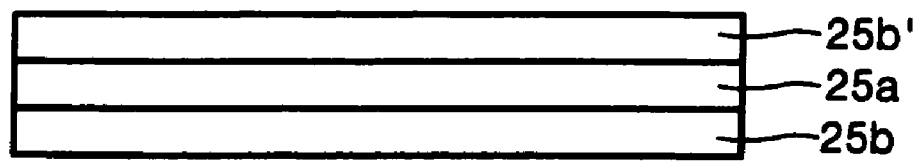

FIGS. 4A and 4B illustrate cross-sectional views of variations of a dielectric layer of the capacitor of the semiconductor device according to the exemplary embodiment of the present invention.

In addition to the structure illustrated in FIG. 3C, the dielectric layer 25 may alternatively be formed by sequentially forming the Ta oxide layer 25b and the Nb oxide layer 25a on the Ru layer 24, as shown in FIG. 4A. As a further alternative, the dielectric layer 25 may be formed by sequentially forming a first Ta oxide layer 25b, the Nb oxide layer 25a, and a second Ta oxide layer 25b' on the Ru layer 24, as shown in FIG. 4B. More specifically, FIG. 4A illustrates an example of the dielectric layer 25 including the Ta oxide layer 25b formed on the Ru layer 24 and the Nb oxide layer 25a formed on the Ta oxide layer 25b. FIG. 4B illustrates an example of the dielectric layer 25 including the first Ta oxide layer 25b formed on the Ru layer 24, the Nb oxide layer 25a formed on the first Ta oxide layer 25b, and the second Ta oxide layer 25b' formed on the Nb oxide layer 25a. Accordingly, the dielectric layer 25 may be formed by sequentially forming the Nb oxide layer 25a and then the Ta oxide layer 25b, sequentially forming the Ta oxide layer 25b and then the Nb oxide layer 25a, or sequentially forming the first Ta oxide layer 25b, the Nb oxide layer 25a, and the second Ta oxide layer 25b'.

Figure 3D:
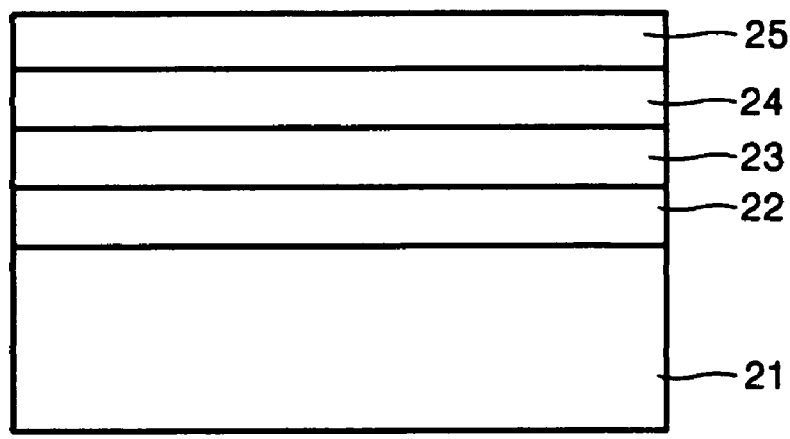

Thereafter, in order to provide the Nb oxide layer 25a and the Ta oxide layer 25b with electrical characteristics, the dielectric layer 25 is crystallized by performing a heat treatment process on the dielectric layer 25 at a high temperature. Preferably, but not necessarily, the dielectric layer 25 is heat-treated at a temperature of about 650° or lower in order to prevent oxygen radicals contained in the Ru layer 24 from diffusing into the TiN layer 23. Since the Nb oxide layer 25a can be crystallized at a temperature of about 550° C., the Ta oxide layer 25b, which contacts the Nb oxide layer 25a, can be crystallized at a relatively low temperature of, for example, about 600° C., even though the Ta oxide layer 25b, such as a $Ta_2O_3$ layer, is usually crystallized at a temperature of about 700° C. Once the dielectric layer 25 is heat-treated at a temperature of about 600° C. using a nitrogen gas ($N_2$) as an atmospheric gas, the dielectric layer 25 is gradually cooled. The heat treatment of the dielectric layer 25 enables the Nb of the Nb oxide layer 25a and the Ta of the Ta oxide layer 25b to diffuse into the Ta oxide layer 25b and the Nb oxide layer 25a, respectively, thereby resulting in the dielectric layer 25, as shown in FIG. 3D.

Figure 3E:
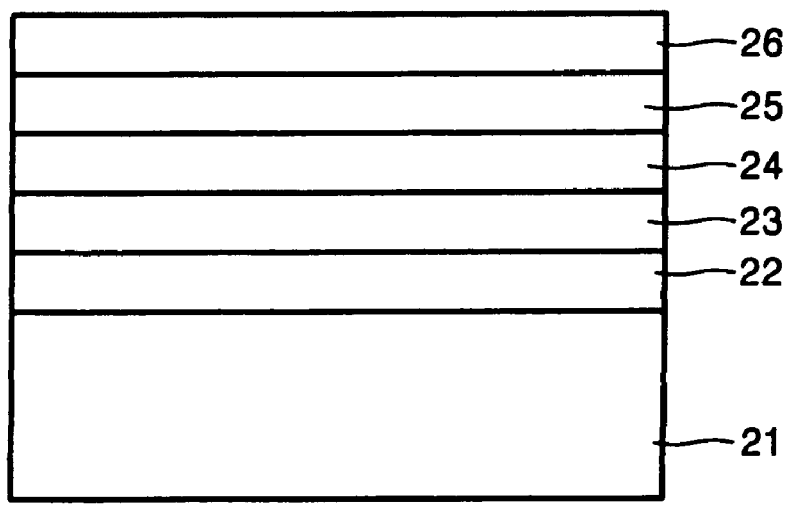

Referring to FIG. 3E, the upper electrode layer 26 is formed on the dielectric layer 25. The upper electrode layer 26 may be formed by depositing a high-conductivity material, such as TiN or Ru, on the dielectric layer 25.

Figure 5A:
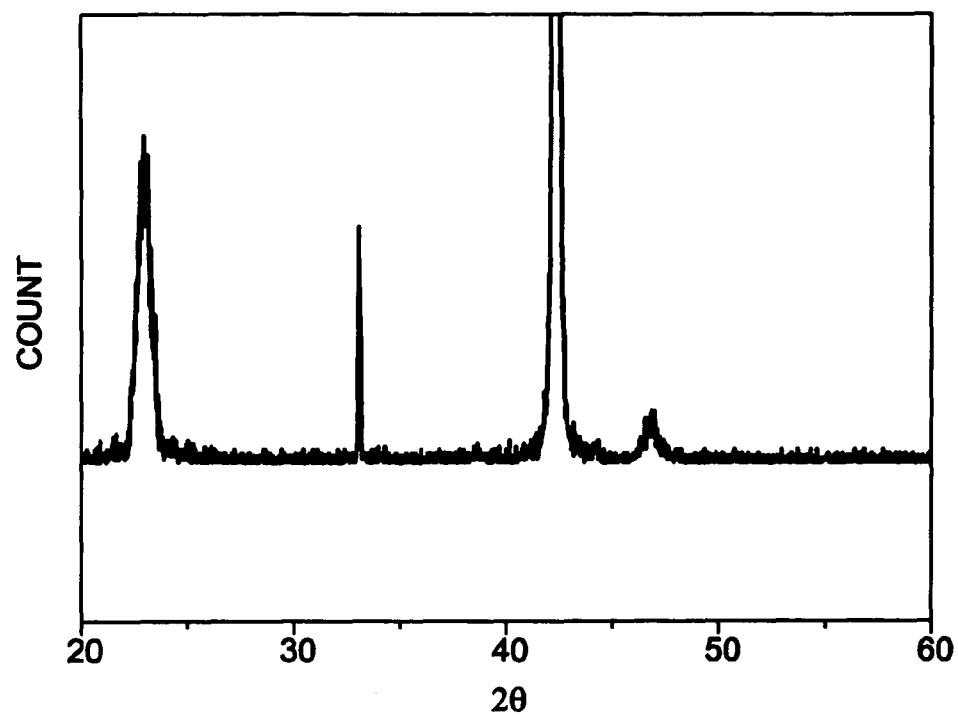
FIG. 5A is a graph illustrating an X-ray diffraction pattern of the capacitor of the semiconductor device according to an exemplary embodiment of the present invention.

FIG. 5A is a graph illustrating an X-ray diffraction (XRD) pattern of count versus 2θ, where 2θ is the angle between the incident and reflected beams, of the capacitor of the semiconductor device according to an exemplary embodiment of the present invention. Referring to FIG. 5A, the capacitor of the semiconductor device according to the exemplary embodiment of the present invention was formed by forming an $Nb_2O_5$ layer 25a to a thickness of about 60 Å, forming a $Ta_2O_5$ layer 25b to a thickness of about 120 Å, and heat-treating the $Nb_2O_5$ layer 25a and the $Ta_2O_5$ layer 25b at a temperature of about 650° C. or lower, e.g., about 600° C. An XRD analysis of the capacitor of the semiconductor device according to the exemplary embodiment of the present invention shows that the $Nb_2O_5$ layer 25a and the $Ta_2O_5$ layer 25b are all crystallized because a peak of a crystal plane [001] of the $Nb_2O_5$ layer 25a is detected at an angle of 23°, and a peak of a crystal plane [002] of the $Ta_2O_5$ layer 25b is detected at an angle of 46°. Peaks detected at angles of 33° and 42° are crystal plane peaks of the Ru layer 24, which serves as an electrode of the capacitor of the semiconductor device according to the exemplary embodiment of the present invention.

Figure 5B:
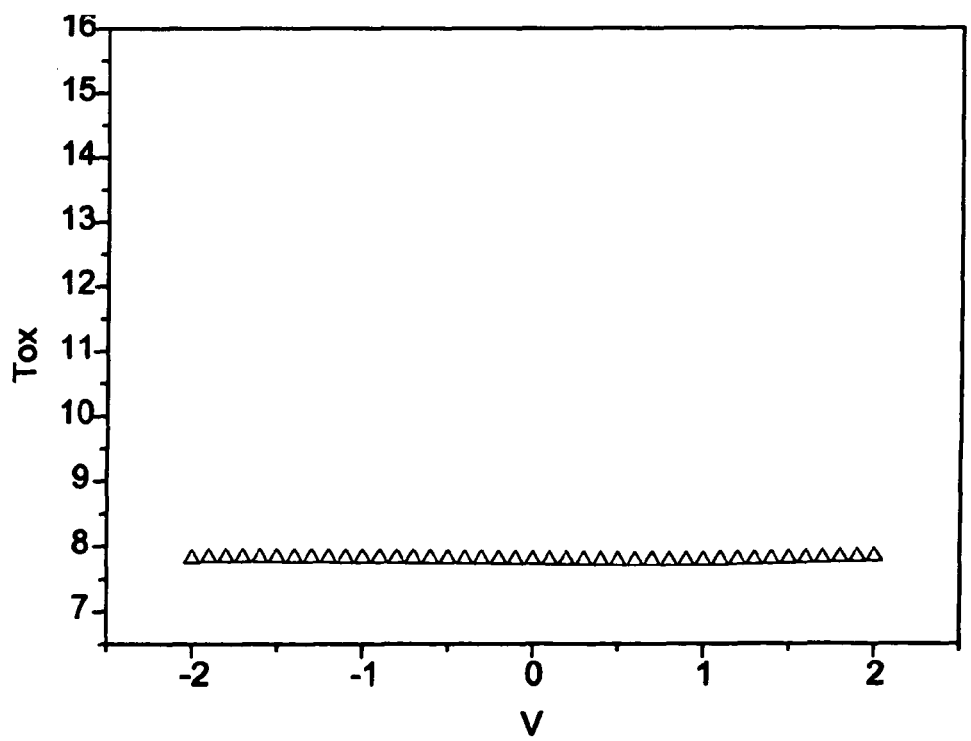
FIG. 5B is a graph illustrating a variation of a thickness-of-oxide (Tox) of the capacitor of the semiconductor device according to an exemplary embodiment of the present invention with respect to potential energy.

FIG. 5B is a graph illustrating a variation of a thickness-of-oxide (Tox) of the capacitor of the semiconductor device according to an exemplary embodiment of the present invention with respect to a potential energy applied thereto. Referring to FIG. 5B, Tox of the capacitor of the semiconductor device according to the exemplary embodiment of the present invention reaches 7.8, which is very low, in a potential energy range of −2 V to 2 V.

As described above, according to the present invention, it is possible to provide structural stability of a capacitor by heat-treating a dielectric layer of the capacitor at a low temperature to provide the dielectric layer with electrical characteristics and to realize a high-density semiconductor device using the capacitor.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A capacitor of a semiconductor device, comprising:
   a lower electrode layer formed from ruthenium (Ru);
   a dielectric layer, the dielectric layer including a first tantalum oxide (Ta) on the lower electrode layer, a niobium oxide (Nb) on the first tantalum oxide layer, and a second tantalum oxide (Ta) layer; and
   an upper electrode layer on the second tantalum oxide layer,
   wherein the niobium oxide layer is placed between the first tantalum oxide layer and the second tantalum oxide layer,
   wherein a thickness of the first tantalum oxide layer is thicker than a thickness of the niobium oxide layer, and
   wherein an amount of niobium oxide in the niobium oxide layer is greater than an amount of niobium oxide in the first tantalum oxide layer.

2. The capacitor as claimed in claim 1, wherein the lower electrode layer comprises:
   a titanium nitride (TiN) layer; and
   a ruthenium (Ru) layer on the TiN layer, the first tantalum oxide layer being directly on the Ru layer.

3. The capacitor as claimed in claim 1, wherein the upper electrode layer comprises a titanium nitride (TiN) or ruthenium (Ru) layer.

4. The capacitor as claimed in claim 1, wherein the niobium oxide layer is crystallized.

5. The capacitor as claimed in claim 1, wherein the niobium oxide layer has a 002 crystal plane.

6. The capacitor as claimed in claim 1, wherein the first tantalum oxide layer is crystallized.

7. The capacitor as claimed in claim 1, wherein the first tantalum oxide layer has a 001 crystal plane.

8. A capacitor of a semiconductor device, comprising:
   a lower electrode layer formed from ruthenium (Ru);
   a dielectric layer, the dielectric layer including a first tantalum oxide (Ta) on the lower electrode layer, a vanadium oxide (V) on the first tantalum oxide layer, and a second tantalum oxide (Ta); and
   an upper electrode layer on the second tantalum oxide layer,
   wherein the vanadium oxide layer is placed between the first tantalum oxide layer and the second tantalum oxide layer, and
   wherein a thickness of the first tantalum oxide layer is thicker than a thickness of the vanadium oxide layer.

9. The capacitor as claimed in claim 8, wherein the first tantalum oxide layer is crystallized.

10. The capacitor as claimed in claim 8, wherein the first tantalum oxide layer has a 001 crystal plane.

* * * * *